US006329668B1

(12) United States Patent
Razeghi

(10) Patent No.: US 6,329,668 B1
(45) Date of Patent: Dec. 11, 2001

(54) QUANTUM DOTS FOR OPTOELECRONIC DEVICES

(75) Inventor: Manijah Razeghi, Wiletle, IL (US)

(73) Assignee: MP Technologies L.L.C., Wilmette, IL (US)

( * ) Notice: Subject to any disclaimer, the term of this patent is extended or adjusted under 35 U.S.C. 154(b) by 0 days.

(21) Appl. No.: 09/628,107

(22) Filed: Jul. 27, 2000

(51) Int. Cl.$^7$ .................................................. H01L 21/00
(52) U.S. Cl. .............................. 257/14; 438/46; 438/56; 438/57
(58) Field of Search ................................. 257/14, 18, 21, 257/184, 460, 615, 201, 15; 438/46, 22–24, 44, 800, 56–63

(56) References Cited

U.S. PATENT DOCUMENTS

| 5,293,050 | 3/1994 | Chapple-Sokol et al. . |
| 5,888,885 | 3/1999 | Xie . |
| 6,011,271 | * 1/2000 | Sukama .................................. 257/14 |
| 6,033,972 | 3/2000 | Ro et al. . |

FOREIGN PATENT DOCUMENTS 90-270508   10/1997  (JP) .

OTHER PUBLICATIONS

In situ fabrication of self–aligned InGaAs quantum dots on GaAs multiatomic steps by metalorganic chemical vapor deposition, M. Kitamura et al., Appl. Phys. Lett. Jun. 1995, vol. 66, No. 26, pp. 3663–3665.

Selective formation of one– and two–dimensional arrayed InGaAs quantum dots using Ga2O3 thin film as a mask material, Cheol Koo Hahn et al., Appl. Phys. Lett., Oct. 1998, vol. 73, No. 17, pp. 2379–2481.

* cited by examiner

Primary Examiner—Charles Bowers
Assistant Examiner—Craig Thompson
(74) Attorney, Agent, or Firm—Welsh & Katz, Ltd.

(57) ABSTRACT

Aluminum Free InGaAs/InGaP quantum dot photoconductive detectors are grown on GaAs substrates by LP-MOCVD.

24 Claims, 4 Drawing Sheets

QUANTUM DOTS FOR OPTOELECRONIC DEVICES

FIELD OF THE INVENTION

This invention relates to intersubband photoconductive detectors, and more particularly to detectors prepared from n-type InGaAs quantum dots in a InGaP matrix.

BACKGROUND OF THE INVENTION

The importance of semiconductor emitters and detectors is rapidly increasing along with progress in the optoelectronic field, such as optical fiber communication, optical data processing, storage and solid state laser pumping.

Quantum dots formed by the Stranski-Krastanow growth mode which is obtained as deposit of the highly strained material on a substrate is promising for developing zero dimensional quantum devices for light emitting sources and detectors.

Quantum dot infrared photodetectors are one of the promising applications for semiconductor devices based on zero dimensional quantum structures. There is an increasing need for sources and detectors for mid and far infrared spectral regions due to the broad range of the applications such as IR spectroscopy of chemical analysis, remote sensing, and atmospheric communications. Similar to the case of quantum well intersubband photodetectors (QWIPs), quantum dots are expected to play an important role in infrared photodetectors. Compared to QWIPs, quantum dot detectors have advantages such as a slowing of the intersubband relaxation time due to reduced electron-phonon interaction. In addition, unlike a quantum well, quantum dots are sensitive to normally incident photons due to the breaking of the polarization selection rules.

Recently, long wavelength infrared (LWIR) intersubband absorption in the range of 60 meV~120 meV from InAs/(Al)GaAs, normal incidence LWIR intersubband absorption around 88 meV from InGaAs/GaAs, and LWIR intersubband absorption around 150 meV from n-doped InAs/GaAs quantum dots have been reported. Also mid-infrared photoconductivity in InAs/AlGaAs at near 3 Φm has been observed.

SUMMARY OF THE INVENTION

An object, therefore, of the invention is a quantum dot intersubband infrared photodetector.

A further object of the subject invention is an photodetector having an active region formed of multiple stacks of aluminum free InGaAs/InGaP quantum dots.

A still further object of the subject invention is an investigation of the optimized growth condition for controlling size of the quantum dots by LP-MOCVD.

DETAILED DESCRIPTION OF THE INVENTION

Figure 1:
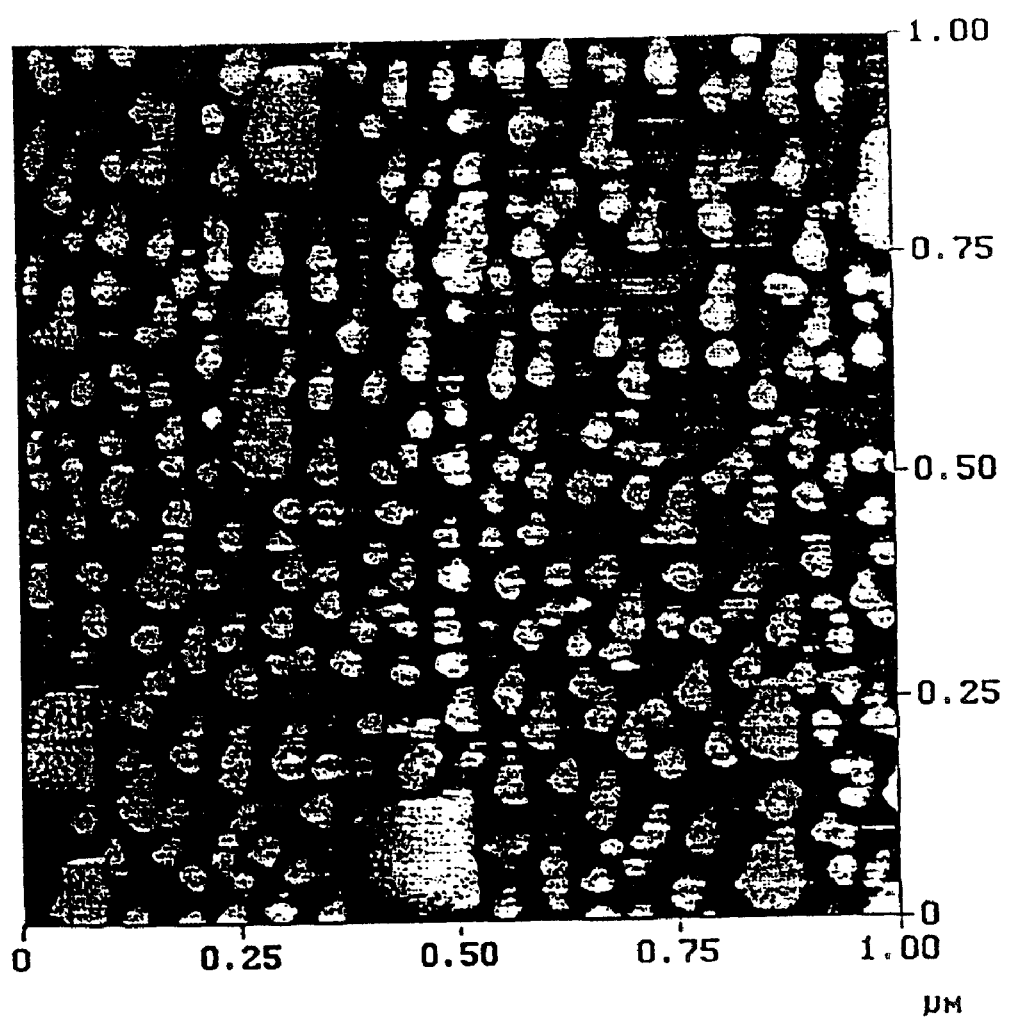
FIG. 1 is a planar AFM scan images of closely packed InGaAs quantum dots on an InGaP matrix (1 Φpm×1Φm) showing spherical dots.

The reactor and associated gas-distribution scheme used herein are substantially as described in U.S. Pat. No. 5,384,151. The system comprises a cooled quartz reaction tube pumped by a high-capacity roughing pump (120 hr$^{-1}$) to a vacuum between 7 and 760 Torr. The substrate was mounted on a pyrolytically coated graphite susceptor that was heated by rf induction. The pressure inside the reactor was measured by a mechanical gauge and the temperature by an infrared pyrometer. A molecular sieve was used to impede oil back-diffusion at the input of the pump. The working pressure was adjusted by varying the flow rate of the pump by using a control gate valve. The gas panel was classical, using ¼-inch stainless steel tubes. Flow rates were controlled by mass flow control.

The reactor was purged with a hydrogen flow of 4 liters min$^{-1}$, and the working pressure of 10–100 Torr was established by opening the gate valve that separated the pump and the reactor. The evacuation line that was used at atmospheric pressure was automatically closed by the opening of the gate valve. The gas flow rates were measured under standard conditions, i.e., 1 atm and 20° C., even when the reactor was at subatmospheric pressure.

The gas sources used in this study for the growth of GaInAs and GaInP by LP-MOCVD are listed below.

| Group-III Sources | Group-V Source |
| --- | --- |
| $In(CH_3)_3$ | t-butylamine |
| $In(C_2H_5)_3$ | $NH_3$ |
| $(CH_3)_2In(C_2H_5)$ | $As(CH_3)_3$ |
| $(CH_3)_2In(C_2H_5)$ | $As(C_2H_5)_3$ |
| $Ga(CH_3)_3$ | $AsH_3$ |
| $Ga(C_2H_5)_3$ | $PH_3$ |

An accurately metered flow of purified $H_2$ for TMIn and TEGa is passed through the appropriate bubbler. To ensure that the source material remains in vapor form, the saturated vapor that emerges from the bottle is immediately diluted by a flow of hydrogen. The mole fraction, and thus the partial pressure, of the source species is lower in the mixture and is prevented from condensing in the stainless steel pipe work.

Pure Arsine ($AsH_3$) and Phosphine ($PH_3$) are used as a source of As and P. The metal alkyl or hydride flow can be either injected into the reactor or into the waste line by using two-way valves. In each case, the source flow is first switched into the waste line to establish the flow rate and then switched into the reactor. The total gas flow rate is about 8 liters min$^{-1}$ during growth. Stable flows are achieved by the use of mass flow controllers.

Dopants usable in the method of the subject invention are as follows:

| n dopant | p dopant |
| --- | --- |
| $H_2Se$ | $(CH_3)_2Zn$ |
| $H_2S$ | $(C_2H_5)_2Zn$ |
| $(CH_3)_3Sn$ | $(C_2H_5)_2Be$ |
| $(C_2H_5)_3Sn$ | $(CH_3)_2Cd$ |
| $SiH_4$ | $(\eta C_2H_5)_2Mg$ |
| $Si_2H_6$ | $Cp_2Mg$ |
| $GeH_4$ | |

The epitaxial layer quality is sensitive to the pretreatment of the substrate and the alloy composition. Pretreatment of the substrates prior to epitaxial growth was thus found to be beneficial. One such pretreatment procedure is as follows:

1. Dipping in $H_2SO_4$ for 3 minutes with ultrasonic agitation;
2. Rinsing in Deionized $H_2O$;
3. Rinsing in hot methanol;
4. Dipping, in 3% Br in methanol at room temperature for 3 minutes (ultrasonic bath);
5. Rinsing in hot methanol;
6. Dipping in $H_2SO_4$ for 3 minutes;
7. Rinsing in deionized $H_2O$, and
8. Rinsing in hot methanol.

After this treatment, it is possible to preserve the substrate for one or two weeks without repeating this treatment prior to growth.

Growth takes place by introducing metered amounts of the group-III alkyls and the group-V hydrides into a quartz reaction tube containing a substrate placed on an rf-heated susceptor surface. The hot susceptor has a catalytic effect on the decomposition of the gaseous products; the growth rate is proportional to the flow rate of the group-III species, but is relatively independent of temperature between 450° and 650° C. and of the partial pressure of group-V species as well. The gas molecules diffuse across the boundary layer to the substrate surface, where the metal alkyls and hydrides decompose to produce the group-III and group-V elemental species. The elemental species move on the hot surface until they find an available lattice site, where growth then occurs.

Theoretical models of epitaxial growth suggest that the growth model is determined by the free energy of the substrate surface ($\sigma s$), the interface free energy ($\sigma i$), and the surface free energy of the heteroepitaxial layer ($\sigma f$), neglecting the strain energy of the film. The inequality $\sigma s > \sigma_f + \sigma_i$ sets the condition for the epitaxial film to wet the substrate. In this case, Frank-Van der Merwe growth which is layer-by-layer may occur. If the inequality has the opposite sign, one usually obtains Volmer-Weber growth, which is islanding and no wetting of the substrate. The Stranski-Krastanow (S-K) growth generally occurs when there is the added complication of interface mixing and/or surface reconstriction. The S-K growth has received much attention due to the successful growth of highly uniform self-assembled quantum dots in this growth mode.

The prediction for the existence of an energy minimum for a particular dot size involves consideration of the dot ensemble energy for an ordered array of identically shaped dots. The energy benefit per surface areas is only weakly increasing with an increase of island size if the total amount of material is fixed, due to a slight decrease of total island surface area. For an array of coherently strained pyramid-like islands on a lattice mismatched surface the total energy $E_A$ equals:

$$E_A = \Delta E_{EL} + E_{FACETS} + E_{EDGES} + \Delta E_{EL} + E_{INTER}$$

where $\Delta E_{EL}^{(1)}$ is the contribution of the lattice mismatch to the elastic relaxation energy, $E_{FACETS}$ is the surface energy of tilted facets, $E_{EDGES}$ is the short-range energy of the edges, $\Delta E_{EL}^{(2)}$ is the contribution of the edges to the elastic relation energy, and $E_{INTER}$ is the energy term of elastic repulsion between island via the strained substrate. The equilibrium structure of islands is determined by the minimum, of the energy $E_A$ per unit surface area, under the constraint of a fixed amount of deposited material which is constrained on all islands.

TABLE 1

Optimum growth conditions.

| | InGaAs | InGaP |
|---|---|---|
| Growth Pressure | 76 | 76 |
| Growth Temperature (C.) | 400 C. | 480 C. |
| Total $H_2$ Flow (liter/min) | 3 | 3 |
| $A_3H_3$ | 20 | — |
| TMI (cc/min) | 19 | 75 |
| TEG (cc/min) | 12 | 75 |
| $PH_3$ (cc/min) | — | 105 |
| Growth Rate (Å/min) | 30 | 250 |

Structure

The InGaAs/InGaP quantum dots were grown on semi-insulating (100) GaAs substrates by low pressure metalorganic chemical vapor deposition (LP-MOCVD). No aluminum was permitted in the growth area. If necessary the reaction tube or other growth area is first cleaned or purged of any aluminum deposits. In this manner all layers grown under the subject invention are aluminum free. Trimethylindium (TMIn), Triethylgallium (TEGa), and pure arsine and phosphine were used as precursors. A 5000 Å thick n-type doped (Si) GaAs bottom contact layer (n+1×10$^{18}$cm$^{-3}$) was first grown on the GaAs substrate, then 1000 Å of undoped lattice matched aluminum free InGaP was deposited. An active region was composed of 10 separate vertical stacks or layers of aluminum free InGaAs quantum dots between two InGaP barrier layers of 350 Å each. Discrete InGaAs quantum dots were formed on the InGaP surface by flowing the sources for several seconds and then interrupting growth for 60 sec. The growth rate was 0.8 ML/s and V/III ratio was 300. The dots were also doped with silicon by supplying $SiH_4$. After the deposition of the 10 stacks or layers of dots, a 1500 Å undoped InGaP layer and a GaAs top contact layer (n=8×10$^{17}$ cm$^{-3}$) were grown on the top. The entire structure was grown at 480 C.

High quality InGaAs/InGaP quantum dots and GaAs layers of the subject invention by low pressure metalorganic chemical vapor deposition (LP-MOCVD). Other forms of deposition of III–V films such as the subject invention, may be used as well including MBE (molecular beam epitaxy), MOMBE (metalorganic molecular beam epitaxy), LPE (liquid phase epitaxy and VPE (vapor phase epitaxy).

Based on these growth conditions, a single layer of InGaAs dots on InGaP was grown. A planar image of high resolution atomic force microscopy (AFM) of the dots is shown in FIG. 1. The average size of the dots was measured at 16 nm in radius, and the shape of the dots was spherical rather than pyramidal. The areal density of the dots is estimated at about 3×10$^{10}$ cm$^{-2}$. The dots may range in size from 5 Å radius to 200 Å radius, and may be spaced from each other an equivalent distance, i.e, from 5 Å to 200 Å. The thickness of these data is also from 5 Å to 200 Å.

Figure 2:
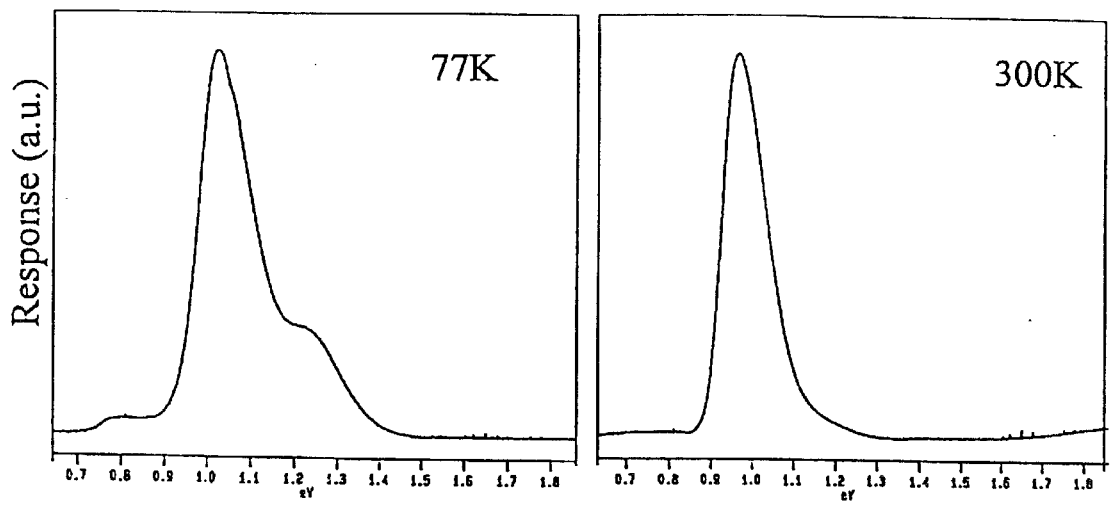
FIG. 2 is a graph of the photoluminescence spectrum of a 10 stack InGaAs quantum dot photodctector structure at 77K and 300K.

A Fourier transform photoluminescence (FTPL) spectrometer was used to measure the luminescence from the dots at various temperatures. Samples were excited by a 488 nm Ar+laser with an excitation power of 2 W/cm$^2$ and the signal was collected by a collected Ge detector. At low temperature, a well-resolved luminescence peak for the wetting layer was observed at 1.23 eV (1.0 Φm) besides the central peak at 10.24 eV (1.21 Φm) which results from the e1-hh1 electron and hole ground state of the InGaAs QDs. The peak from the wetting layer decreased with increasing temperature and it disappeared above 150K. Strong room temperature luminescence was observed at 0.96 eV (1.29 Φm) from e1-hh1 ground state. The consistent FWHM of the peak as 76 meV was also observed through the temperature range from 77K to 300K. The photoluminescence spectra are shown in FIG. 2.

A 400 Φm×400 Φm photoconductive detector was fabricated with wet chemical etching through the bottom contact layer. AuGe/Ni/Au contact pads (100 Φm×100 Φm) were evaporated and alloyed on the top and bottom contact layers. The sample was then mounted to a copper heatsink and attached to the cold finger of a liquid nitrogen cryostat equipped with a temperature controller.

A Galaxy 3000 Fourier transform infrared (FTIR) spectrometer was used to measure the spectral photoresponse. The sample was illuminated through the front side at normal incidence. Absolute detector responsivity was determined by suing a blackbody radiation source. The temperature of the blackbody source was maintained at 1000K and a modulating frequency 400 Hz was used. The absolute responsivity was obtained from.

$$D^* = R_p\sqrt{A\Delta f} / i_n$$
$$= R_p\sqrt{A\Delta f} / \sqrt{4eI_d g}$$

where Ip is the measured detector current, $A_d$ is the detector area, $D_A$ is the blackbody aperture diameter and r is the distance between the aperture and the detector, Φ is the Stefan-Boltzmann constant, and $T_{BB}$ is the temperature of the blackbody. The k is the correction factor due to the overlap of the relative spectral responsivity of the detector S(λ) and the blackbody spectra, $M(T_{BB},\lambda)$.

Figure 3:
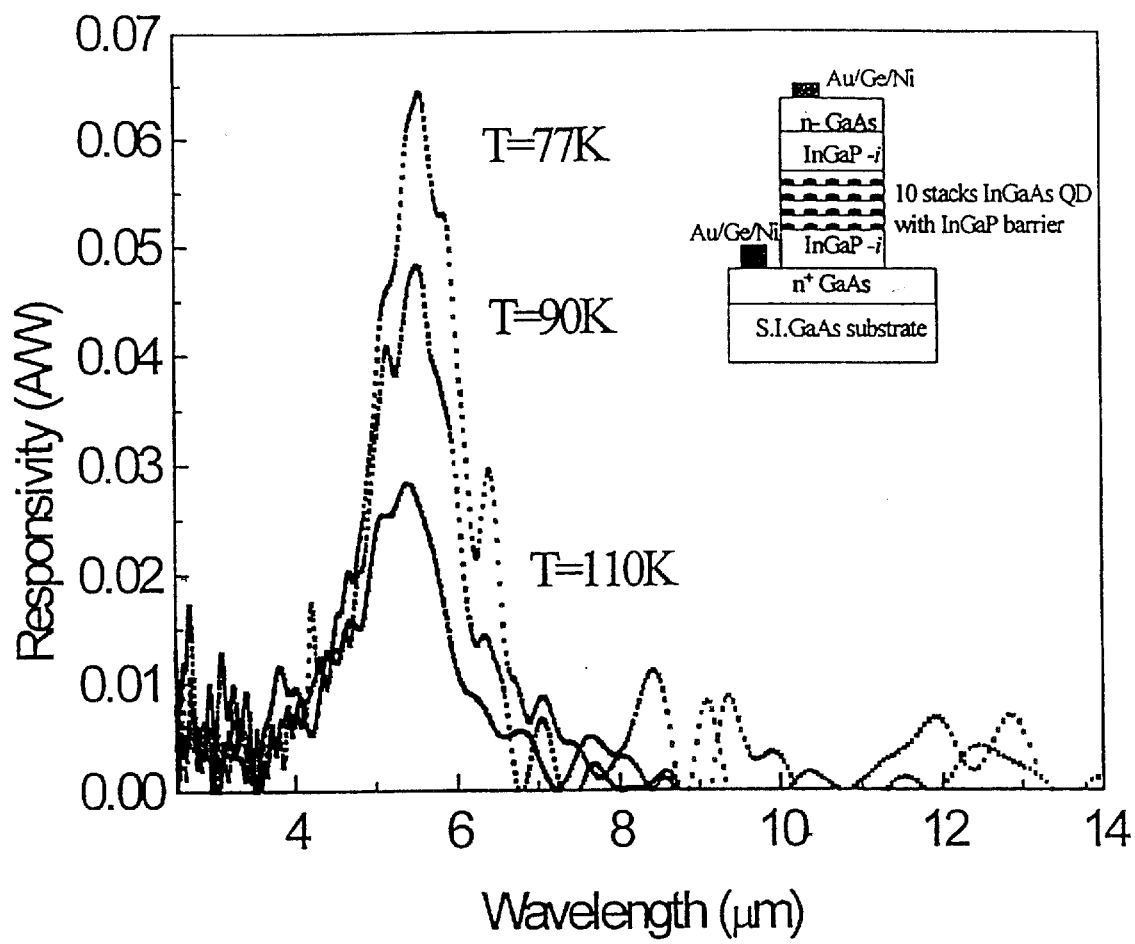
FIG. 3 is a graph of the responsively of the quantum dots photoconductive detector at various temperatures.

FIG. 3 shows the detector responsivity of a sample at various temperatures. The spectra show the intersubband transition at 5.5 Φm at 77K with the peak responsivity of 0.067 A/W at −2V bias. The cutoff wavelength was 6.5 Φm at 77K. The photoconductive signal was observed up to 130K. Beyond this temperature, the spectral response degraded due to the rapid increase of noise with temperature. The spectral FWHM of 48 meV (*λλ=20%) was independent of temperature up to 110K. This narrow response is compared to the previously reported results of broad intersubband absorption. The large broadening of the spectrum was attributed to the dispersion of the electron confinement energies of dots due to the size fluctuation. The results suggest the dot size may be controlled by MOCVD.

The dark current noise $i_n$ was measured with the noise spectrum analyzer (SR760 FFT) and current amplifier (Keithley 428). The specific detectivity at peak wavelength is determined by the noise current $i_n$, $$R_l 1(A/W) = k \cdot \frac{I_p}{\frac{(D_A^2 A_d)}{4r^2}\sigma \cdot T_{BB}^4} ; k = \frac{\sigma \cdot T_{BB}^4}{\int_0^\infty M(T_{BB},\lambda)S(\lambda)d\lambda}$$

where $R_p$ is the peak responsivity, A is the detector area Id is the dark current, and gi si the optical gain. The measured noise current, in=1.49×10$^{-10}$ A Hz$^{-1/2}$, resulted in a peak detectivity of 4.74×10$^7$ cm Hz$^{1/2}$/W at 5.5 Φm at 77K with −2V bias. This value is the first reported detectivity of quantum dot infrared photodetector.

Figure 4:
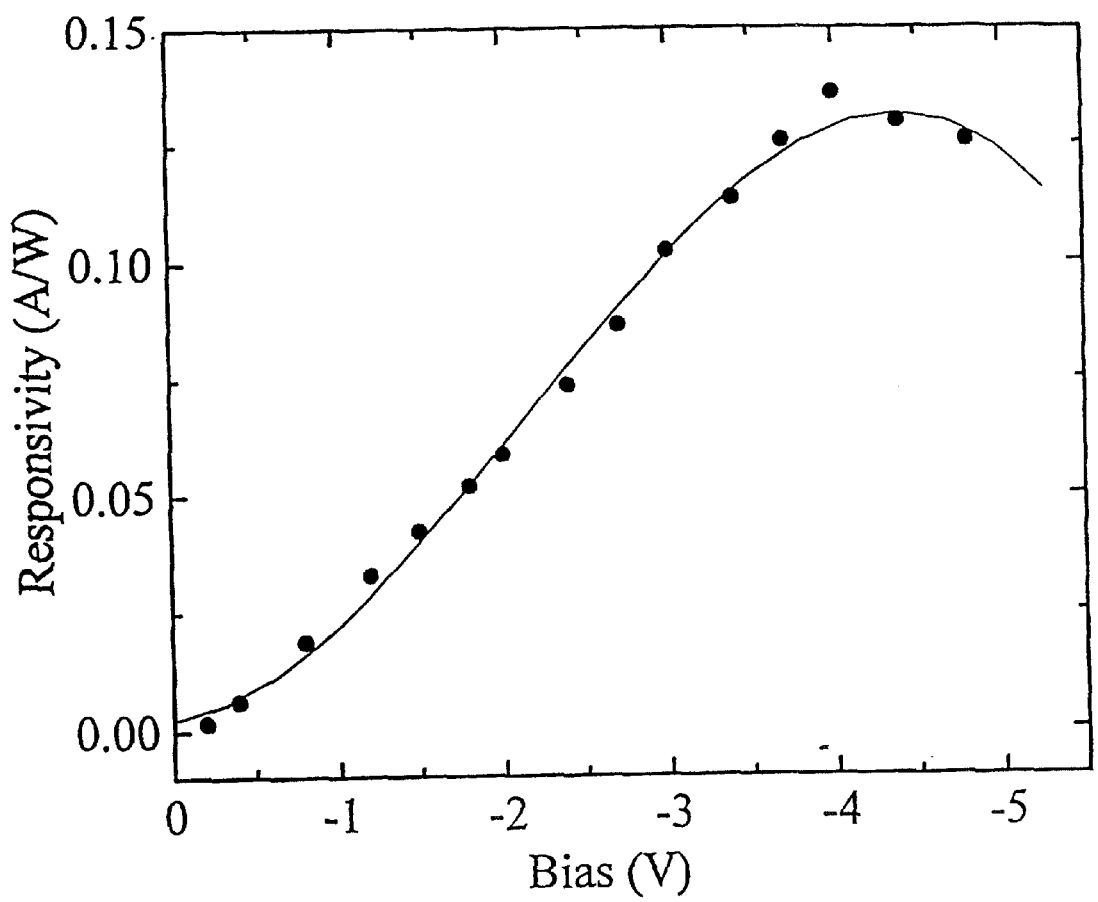
FIG. 4 is a graph of the bias voltage dependent responsively of the InGaAs/InGaP quantum dot photoconductive detector at 77K.

The measured responsivity increases linearly with bias at low bias voltage and saturates at around −4.5V as shown in FIG. 4. This may be due to the saturation velocity of the generated carriers in large electric field.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments and equivalents.

I claim:

1. An optoelectronic device, comprising a photodetector having a structure with a substrate layer, a lower contact layer, an upper and lower barrier layer of InGaP, an upper contact layer; and an active layer between said upper and lower barrier layer, said active layer comprising about 5 to about 30-layers of aluminum free quantum dots of InGaAs.

2. The device of claim 1, wherein said active layer includes 10 layers of quantum dots.

3. The device of claim 1, wherein the upper and lower barrier layers are each 350 Å thick.

4. The device of claim 1, wherein the lower contact layer is GaAs.

5. The device of claim 4, wherein the upper contact is GaAs, doped with Si, Ge, S, or mixtures thereof.

6. The device of claim 1, wherein the lower barrier layer is 1000 Å thick.

7. The device of claim 1, wherein the upper barrier layer is 1500 Å thick.

8. The device of claim 1, wherein the upper and lower barrier layers are InGaP.

9. The device of claim 1, wherein the upper and lower contact layers are each doped with an n-type dopant.

10. The device of claim 9, wherein the upper and lower contact layers are each doped with Si.

11. The device of claim 1, wherein said quantum dots are doped with an n-type dopant.

12. The device of claim 11, wherein said quantum dots are doped with Si.

13. The device of claim 1, wherein the active layer comprises 10 layers of quantum dots.

14. The device of claim 1, wherein the quantum dots include a plurality of discrete spherical areas, each dot being from about 5 Å to about 200 Å in radius.

15. The device of claim 1 wherein the quantum dots are spherical.

16. The device of claim 14, wherein the quantum dots have an average radius of about 16 nm.

17. The method of preparing a photodetector device comprising the steps of:

(a) growing a lower contact layer on a substrate;

(b) growing a lower barrier layer on said lower contact layer;

(c) growing from about 5 to about 30 separate vertical layers of quantum dots in InGaAs on said lower barrier layer;

(d) growing an upper barrier layer;

(e) growing an upper contact layer on said barrier layer;

(f) etching said upper and lower contact layer; and (g) forming contacts on said upper and lower contact layers.

18. The method of claim 16, wherein the step of growing the active layer includes growing about 10 layers of quantum dots.

19. The method of claim 17, wherein the step of growing the active layer includes growing plurality of discrete quantum dots in each layer.

20. The method of claim 17, including the step of doping the upper and lower contact layer.

21. The method of claim 17, including the step of doping the upper and lower contact layer with Si.

22. The method of claim 17, including the step of doping the quantum dots with an n-type dopant.

23. The method of claim 17, including the step of growing the upper and lower barrier layers of InGaP.

24. The method of claim 23, including the step of growing the upper and lower contact layer of GaAs.

* * * * *